(12) United States Patent  
Joffe

(10) Patent No.: US 8,432,226 B1
(45) Date of Patent: Apr. 30, 2013

(54) AMPLIFIER CIRCUITS AND METHODS FOR CANCELLING MILLER CAPACITANCE

(75) Inventor: Daniel M. Joffe, Owens Crosswords, AL (US)

(73) Assignee: ADTRAN, Inc., Huntsville, AL (US)

( * ) Notice: Subject to any disclaimer, the term of this patent is extended or adjusted under 35 U.S.C. 154(b) by 0 days.

(21) Appl. No.: 13/179,297

(22) Filed: Jul. 8, 2011

Related U.S. Application Data

(60) Provisional application No. 61/362,548, filed on Jul. 8, 2010.

(51) Int. Cl.
*H03F 1/14* (2006.01)
(52) U.S. Cl.
USPC .......................................... 330/292; 330/257
(58) Field of Classification Search .................. 330/292, 330/257, 261
See application file for complete search history.

(56) References Cited

U.S. PATENT DOCUMENTS

| | | | | |
|---|---|---|---|---|
| 5,486,790 A | * | 1/1996 | Huijsing et al. | 330/260 |
| 6,542,030 B2 | * | 4/2003 | Huijsing et al. | 330/252 |

* cited by examiner

*Primary Examiner* — Henry Choe
(74) *Attorney, Agent, or Firm* — Maynard Cooper & Gale, P.C.; Jon E. Holland

(57) ABSTRACT

An amplifier circuit has an input stage, a current mirror stage, and an output stage. The output stage has a transistor for which a non-linear and/or linear Miller capacitance exists across the transistor. A capacitive element, referred to herein as a "negative Miller capacitor," is coupled between an input node of the current mirror stage and the transistor's collector or drain causing the current flowing through the negative Miller capacitor to be inverted, supplying the current taken by the usual Miller capacitance of the output stage. Thus, the negative Miller capacitor cancels the usual Miller capacitance across the transistor of the output stage, and such cancellation occurs without significantly increasing the amplifier's input power and costs. In some embodiments, both linear and non-linear components of the usual Miller capacitor are cancelled. Further, cancellation of the Miller capacitance generally enhances bandwidth and reduces distortion, thereby improving the performance of the operational amplifier.

20 Claims, 5 Drawing Sheets

AMPLIFIER CIRCUITS AND METHODS FOR CANCELLING MILLER CAPACITANCE

CROSS REFERENCE TO RELATED APPLICATION

This application claims priority to U.S. Provisional Patent Application No. 61/362,548, entitled "Negative Miller Capacitor for Bandwidth Enhancement and Distortion Reduction" and filed on Jul. 8, 2010, which is incorporated herein by reference.

RELATED ART

An operational amplifier (op-amp) is a well-known device used to provide a voltage and/or current gain to an input signal. Such an amplifier typically has an input stage, a current mirror stage, and an output stage. A transistor of the output stage has a natural non-linear Miller capacitance across its base and collector, for a bipolar transistor, or across its gate and drain, for a field effect transistor (although the non-linearity of $C_{gd}$ in a metal-oxide-semiconductor field-effect transistor (MOSFET) is typically much smaller than in a bipolar transistor). The presence of this Miller capacitance limits the bandwidth of the output stage. That bandwidth varies with the non-linear capacitance, causing distortion. Often, the non-linear capacitor is supplemented by a parallel linear capacitor to make the bandwidth more predictable and reduce distortion. A capacitor positioned at such location is typically referred to as a "Miller capacitor."

Previous attempts to cancel the portion of the Miller capacitance built into the semiconductor devices have various shortcomings. In particular, they use an additional inverting output stage, which consumes extra power, and/or they are unable to cancel the non-linear components of the Miller capacitance. If the non-linear components of the Miller capacitance can be cancelled without adding an additional inverting output stage, then it is possible to make a wider bandwidth amplifier having less distortion for a given amount of power consumption. Moreover, techniques for compensating for the non-linear and/or linear Miller capacitance in the output stage of an operational amplifier without adversely affecting the amplifier's cost or performance, in terms of input power, speed, and area, are generally desired.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to amplifier circuits for cancelling Miller capacitance. In one exemplary embodiment, a circuit for an operational amplifier has an input stage, a current mirror stage, and an output stage. The output stage has a transistor for which a non-linear and/or linear Miller capacitance exists across the transistor. A capacitive element, referred to herein as a "negative Miller capacitor," is coupled between the transistor's collector or drain and the input of the current mirror stage. The voltages across both the Miller and the Negative Miller capacitors are substantially the same. However, the inversion of the current mirror causes all the current taken by the Miller capacitor to be supplied by the action of the current mirror in concert with the negative Miller capacitor. This nullifies the effect of the Miller capacitor of the output stage. If the current mirror has unity gain and the negative Miller capacitor and the Miller capacitor have similar capacitance versus voltage characteristics, then the negative Miller capacitor can cancel linear and/or non-linear components of the Miller capacitor. Such cancellation occurs without significantly increasing the amplifier's input power and costs. Further, cancellation of the Miller capacitance of the output stage generally enhances bandwidth and reduces distortion, thereby improving the performance of the operational amplifier.

Figure 1:
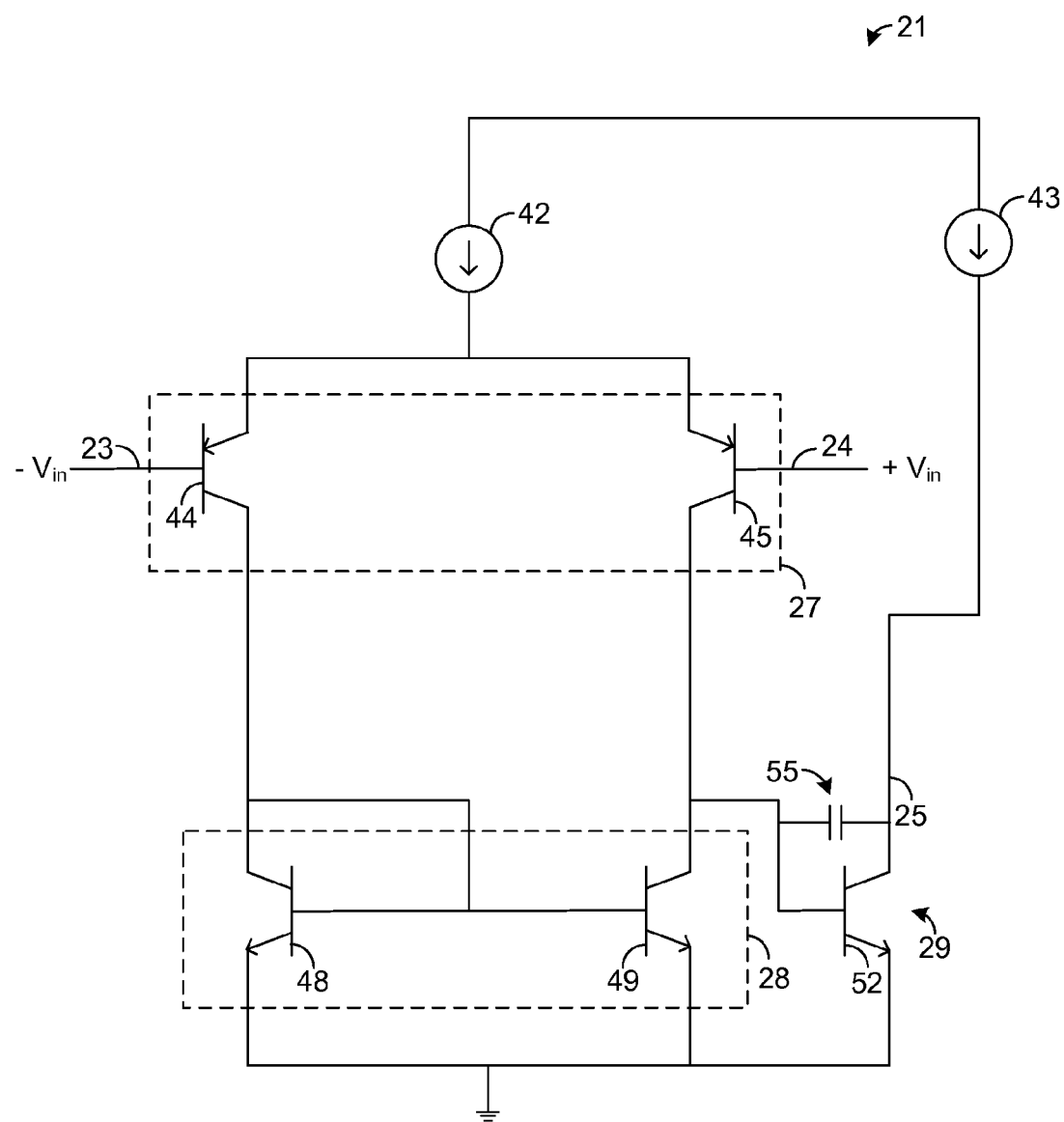
FIG. 1 is a circuit diagram illustrating a conventional Miller-compensated amplifier circuit.

FIG. 1 depicts a conventional amplifier circuit 21. As shown by FIG. 1, the amplifier circuit 21 has two input connections 23 and 24 for receiving a differential voltage input, negative (−) $V_{in}$ and positive (+) $V_{in}$. The amplifier circuit 21 also has an output connection 25 for providing an output voltage ($V_{out}$). The amplifier circuit 21 amplifies the differential input voltage such that the output voltage has a significant gain relative to the differential input voltage.

As shown by FIG. 1, a current source 42 supplies bias current to input stage 27, and a current source 43 supplies current to the output stage 29. The input stage 27 comprises a pair of PNP transistors 44 and 45, collectively referred to as a "differential input pair," that receive input signals for amplification by the circuit 21. The current mirror stage 28 comprises a pair of NPN transistors 48 and 49, and the output stage 29 comprises an NPN transistor 52. Stage 28 is a "current mirror" in that the same amount of current ideally flows through each of the transistors 48 and 49. The output stage 29 outputs amplified signals from the amplifier circuit 21. Note that the transistors of the amplifier circuit 21 may be bi-polar or field effect transistors. For illustrative purposes, it will be assumed that the transistors are bi-polar, though the circuitry shown by FIG. 1 may be implemented with field effect transistors, if desired. As known in the art, the collector current ($I_c$) in a bipolar transistor is controlled by the base-to-emitter voltage ($V_{BE}$).

There exists a natural non-linear Miller capacitance across the base and collector of the transistor 52 for the output stage 29. The non-linear nature of such capacitance ($C_m$) undesirably results in changing bandwidth with changing output voltage, which can be swamped by connecting the base and collector via a Miller capacitor 55 having linear Miller capacitance ($C_L$). The total capacitance across the base and collector of the transistor 52 is equal to $C_m + C_L$.

Figure 2:
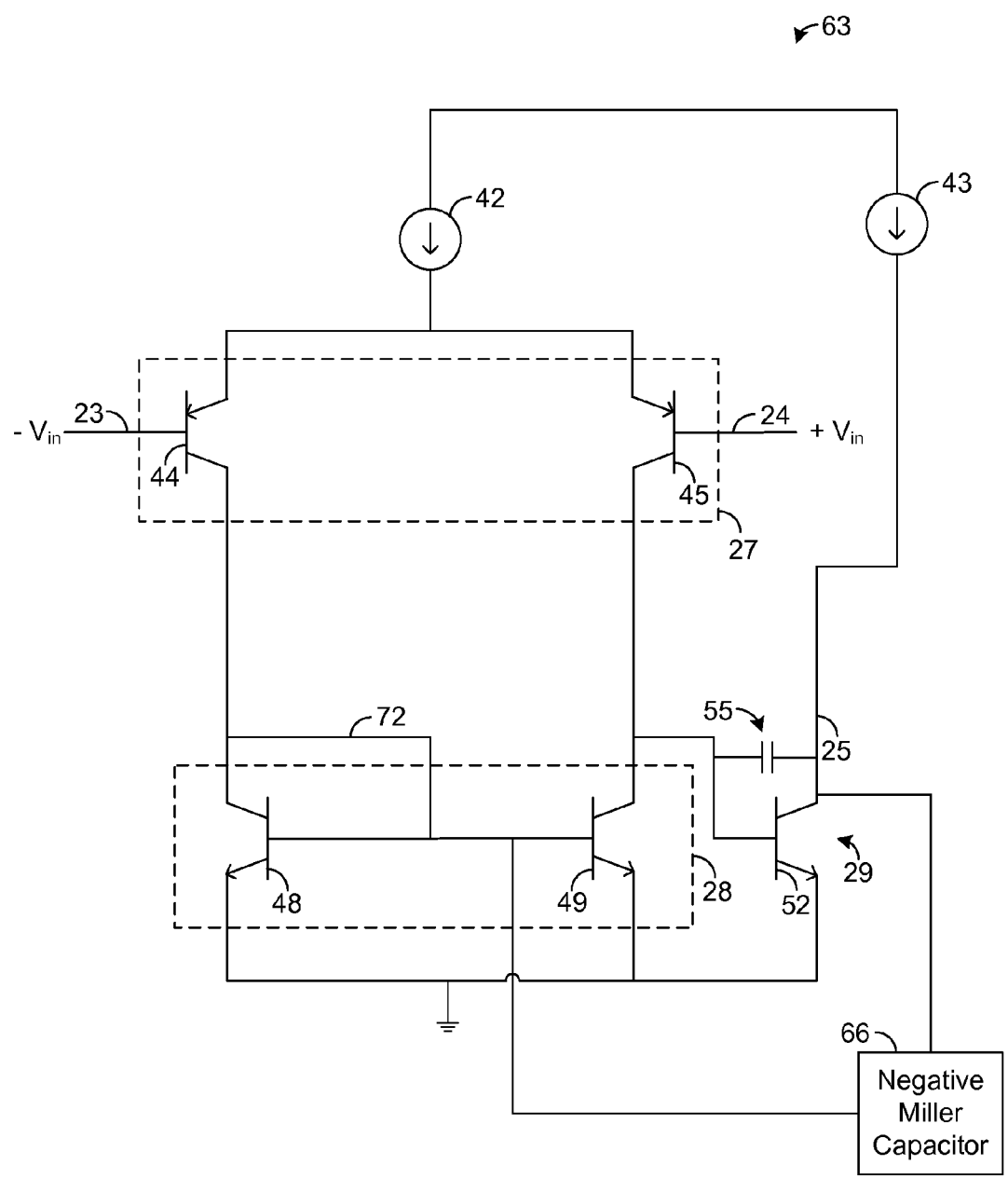
FIG. 2 is a circuit diagram illustrating an exemplary embodiment of a Miller-compensated amplifier circuit having a negative Miller capacitor for cancelling non-linear Miller capacitance of an output stage.

FIG. 2 depicts an exemplary embodiment of an amplifier circuit 63. Except as is otherwise described herein, the circuit 63 is configured and operates the same as the conventional circuit shown by FIG. 1. As shown by FIG. 2, the circuit 63 comprises a capacitive element 66, referred to herein as a "negative Miller capacitor," that has a non-linear capacitance ($C_n$) for counteracting the non-linear Miller capacitance ($C_m$) of the output transistor 52. In one exemplary embodiment, the negative Miller capacitor 66 cancels $C_m$ such that the total capacitance across the base and collector of the transistor 52 is approximately equal to the linear capacitance ($C_L$) of the Miller capacitor 55.

Figure 3:
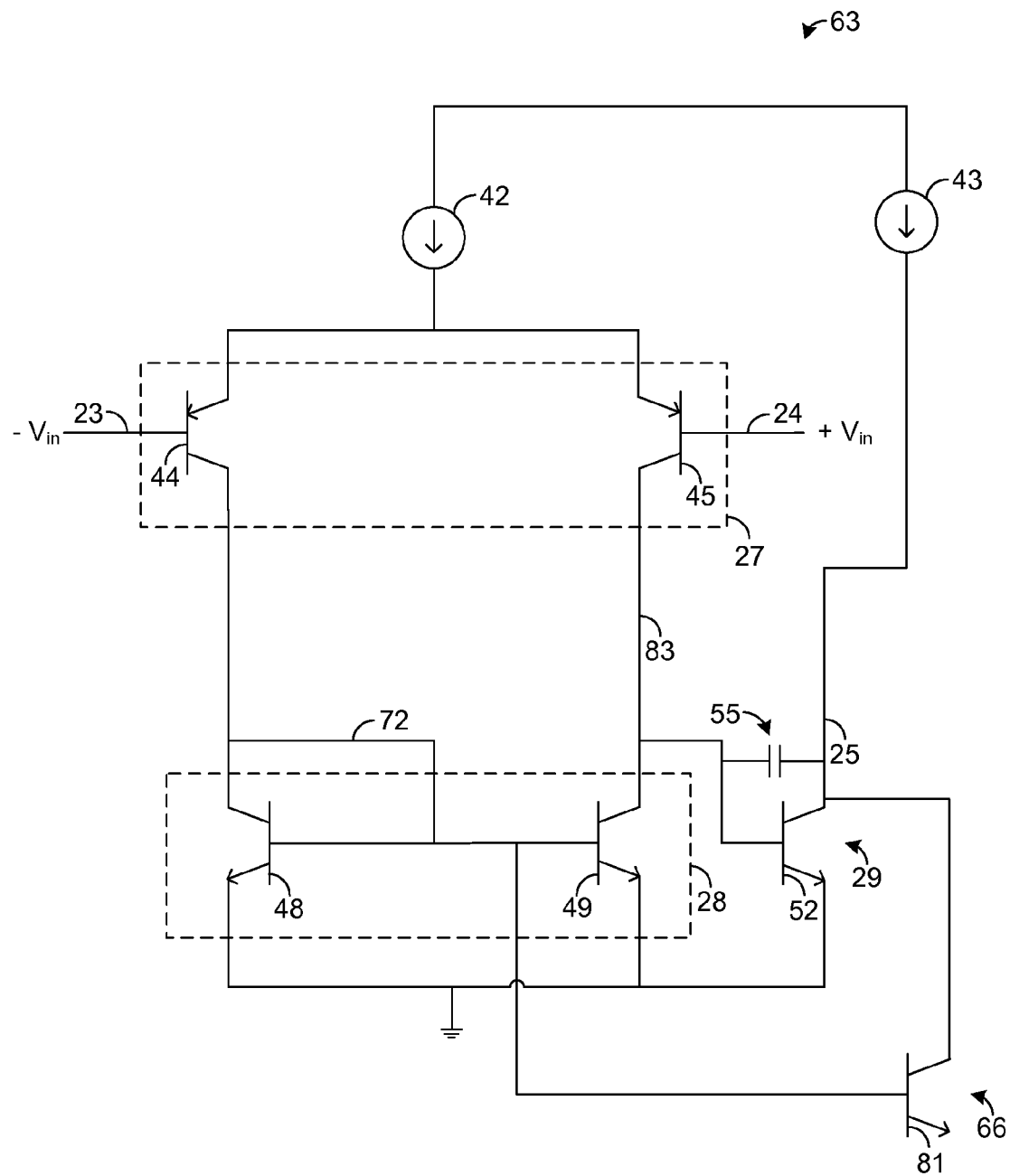
FIG. 3 is a circuit diagram of the Miller-compensated amplifier circuit of FIG. 2 when the negative Miller capacitor comprises a transistor similar to a transistor of the output stage.

In this regard, the negative Miller capacitor 66 is coupled between the output connection 25 (and, hence, the collector of the transistor 52) and a node 72, referred to hereafter as "input node," of the current mirror 28. FIG. 3 depicts an exemplary embodiment of the negative miller capacitor 66, which in the embodiment shown by FIG. 3 is a transistor 81 having a collector coupled to the collector of the output transistor 52 and a base coupled to the input node 72 of the current mirror 28. The transistor 81 preferably matches (e.g., is of the same size and type) the output transistor 52 and, thus, has similar characteristics as the output transistor 52. In the embodiment shown by FIG. 3, the emitter of the transistor 81 is left open. In this regard, the emitter of the transistor 81 is not electrically coupled to any electrical component, though it is possible for the emitter to be coupled to an electrical component in other embodiments. Further, in other embodiments, the negative Miller capacitor 66 may have other configurations and/or use other types of devices.

Notably, all the capacitors under discussion (including the Miller capacitor 55, the negative Miller capacitor 66, and the capacitive components of the transistor 52) have the same connection on one side, that being output connection 25. The other end of each capacitor connects to voltages very much smaller than the output voltage 25. Thus, all the capacitors have substantially the same voltage across them. Mirror 28 inverts the current flowing through the negative Miller capacitor (81 in FIG. 4, or 66 in FIG. 3). This inversion provides a current that can cancel the current taken by either capacitor 55, or the non-linear collector to base capacitance of output transistor 52. Therefore, given that the transistor 81 has similar characteristics as the output transistor 52, the collector-to-base current of the transistor 81 should be largely the same as the collector-to-base current of the output transistor 52. Thus, the transistor 81 should have a natural non-linear Miller capacitance across its base and collector that matches the non-linear Miller capacitance ($C_m$) across the base and collector of the output transistor 52. However, due to the current inversion described above, the non-linear Miller capacitance $C_n$ of the transistor 81 counteracts the non-linear Miller capacitance $C_m$ of the output transistor 52. Accordingly, in the embodiment shown by FIG. 4, the non-linear Miller capacitance $C_m$ of the output transistor 52 is cancelled such that the total capacitance across the base and collector of the output transistor 52 is the linear capacitance $C_L$ of the Miller capacitor 55, thereby providing enhanced control of bandwidth and better distortion characteristics relative to an embodiment in which a Miller capacitor 55 is used to compensate, without cancelling, the non-linear Miller capacitance $C_m$. Moreover, due to the cancellation of the non-linear Miller capacitance, the amplifier circuit 63 exhibits a more linear behavior.

Since the transistor 81 of the negative Miller capacitor 66 has similar characteristics as the output transistor 52 and via the action of the mirror 28 results in an inverted current relative to the current fed to the output transistor 52, any change in the non-linear Miller capacitance $C_m$ of the output transistor 52 due to a change in the collector-to-base voltage ($V_{CB}$) of the output transistor 52 or otherwise should be reflected in the non-linear Miller capacitance $C_n$ of the negative Miller capacitor 66. Accordingly, the complementary behavior of the negative Miller capacitor 66 ensures cancellation across a range of voltages.

Note that in some cases, it may be desirable to limit the amount of Miller capacitance that is cancelled. As an example, in a unity gain stable operational amplifier, it may be desirable to have a small difference between $C_m$ and $C_n$ to provide enough feedback current to achieve a desired pole splitting behavior. Such a difference can be achieved by configuring the transistor 81 of the negative Miller capacitor 66 to have a slightly different size relative to the output transistor 52.

In some other cases, one may choose to cancel all the nonlinear Miller capacitance $C_m$, but still place a modest amount of linear capacitance via the Miller capacitor 55. The result will have less bandwidth variation with output voltage that a similar stage having uncancelled non-linear Miller capacitance.

In addition, in some cases, such as a high bandwidth or gain application, it may be desirable to remove the Miller capacitor 55 such that cancellation of the non-linear Miller capacitance $C_m$ effectively drives the capacitance across the base and collector of the output transistor 52 to approximately zero. Such an embodiment generally provides maximum bandwidth for a given amount of input current to the amplifier circuit 63.

Figure 4:
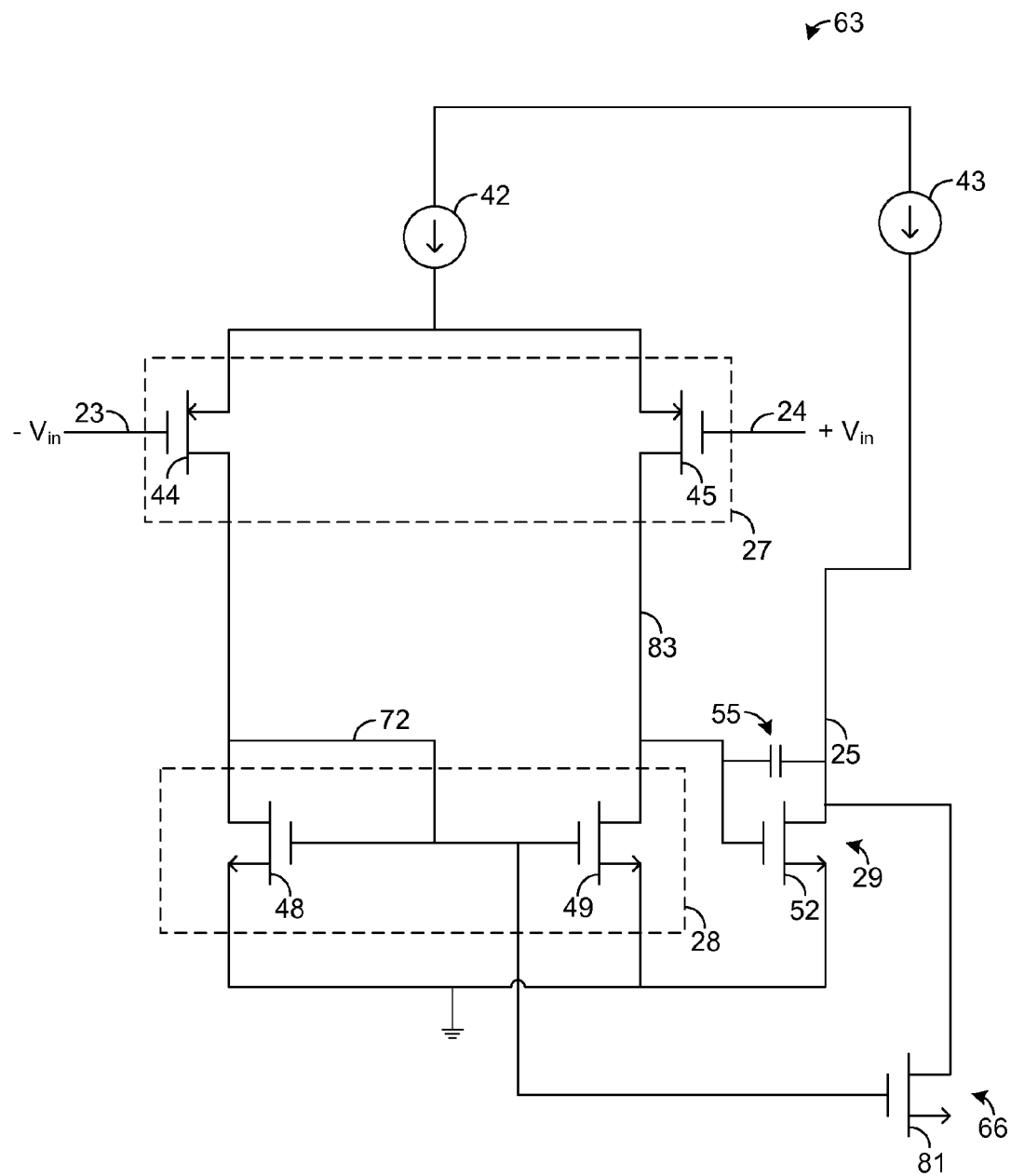
FIG. 4 is a circuit diagram illustrating an exemplary embodiment of a Miller-compensated amplifier circuit that is implemented with field effect transistors.

In the exemplary embodiments described above, the transistors 44, 45, 48, 49, 52, and 81 are implemented as bipolar transistors. However, it is possible for such transistors to be implemented as field effect transistors, or with combinations of both bipolar and field effect transistors. FIG. 4 depicts an exemplary embodiment in which the transistors 44, 45, 48, 49, 52, and 81 are implemented as field effect transistors. As can be seen by comparing FIGS. 3 and 4, the configuration and operation of the embodiment shown by FIG. 4 is similar to those of the embodiment shown by FIG. 3. In the embodiment shown by FIG. 4, the drain of the output transistor 52 is coupled to the drain of the transistor 81, and the gate of the transistor 81 is coupled to the gates of the current mirror transistors 48 and 49 and, hence, the drain of the input transistor 44, as well as the collector of the current mirror transistor 48.

Note that when the output transistor 52 is a field effect transistor, its drain-to-gate capacitance is substantially linear. In such case, the capacitance of the negative Miller capacitor 66 is substantially linear as well.

Figure 5:
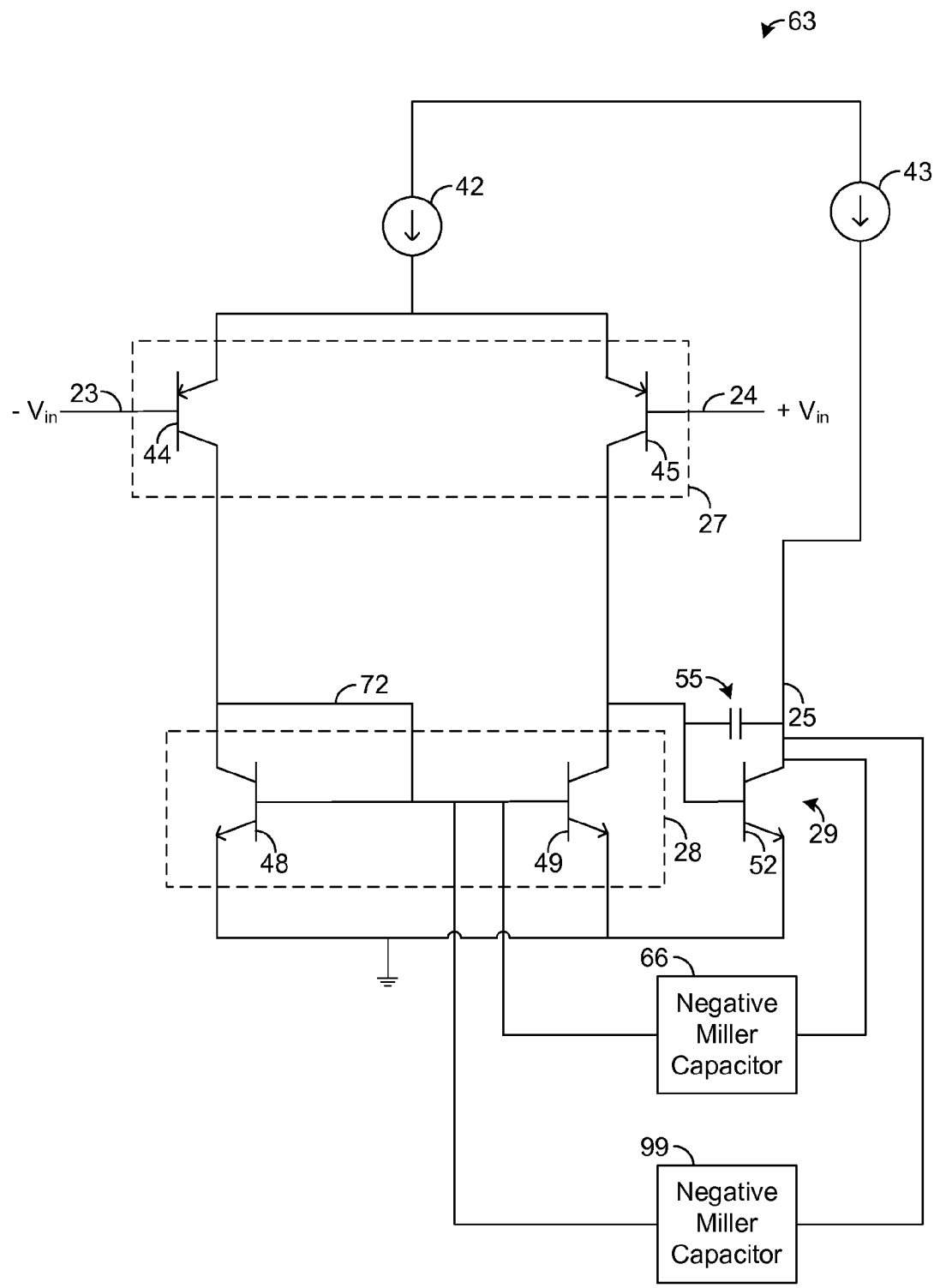
FIG. 5 is a circuit diagram illustrating an exemplary embodiment of a Miller-compensate amplifier circuit in which a combination of linear and non-linear capacitances is cancelled from an output stage of the circuit.

In some embodiments, it is possible for the Miller capacitance of the output stage 29 to have both linear and non-linear components, and it may be desirable to cancel both types of capacitances. FIG. 5 depicts an exemplary embodiment that is configured to cancel both linear and non-linear Miller capacitances. In this regard, a negative Miller capacitor 66 is configured to cancel the non-linear component of the Miller capacitance of the output stage 29, as described above. In addition, there is a negative Miller capacitor 99 in parallel with the negative Miller capacitor 66 between the output connection 25 and the input node 72 of the current mirror stage 28. The negative Miller capacitor 66 has a substantially linear capacitance that matches the substantially linear component of the Miller capacitance to be cancelled in the output stage 29. Thus, the negative Miller capacitor 66 cancels the undesired non-linear Miller capacitance of the output stage 29, and the negative Miller capacitor 99 cancels the undesired linear Miller capacitance of the output stage 29.

The negative Miller capacitor 66 can be implemented via a field effect transistor (not shown) having a drain coupled to the output connection 25 and a gate coupled to the input node 72. In such case, the source may be left open similar to the emitter of the transistor 81 in FIG. 3. Other types of devices providing a linear capacitance may be used in other embodiments.

If desired, the negative Miller capacitors 66 and 99 may be configured to cancel all of the linear and non-linear Miller capacitances of the output stage 29 thereby driving the total Miller capacitance of the output stage 29 to zero. In such an embodiment, the circuit 63 may be implemented without the Miller capacitor 55. However, in an alternative embodiment, the Miller capacitor 55 may used in order to control the bandwidth of the circuit 63, as may be desired. In such an embodiment, the negative Miller capacitors 66 and 99 may cancel all of the natural Miller capacitances built into the devices used to implement the output stage 29, and the Miller capacitor 55 may be added to provide precise and predictable control of the circuit bandwidth.

Now, therefore, the following is claimed:

1. An amplifier circuit, comprising:
   an input stage having a first input transistor and a second input transistor;
   a current mirror stage having an input node, a first current mirror transistor, and a second current mirror transistor, the first and second current mirror transistors coupled to the input node, the second current mirror transistor coupled to the second input transistor, and the input node coupled to the first input transistor;
   an output stage having an output transistor coupled to an output connection and to the second current mirror transistor; and
   a capacitive element coupled to the output connection and to the input node, wherein a current through the capacitive element is inverted relative to a current fed to the output transistor by the current mirror stage such that a Miller capacitance of the capacitive element counteracts a Miller capacitance of the output transistor, and wherein the capacitive element is configured such that the Miller capacitance of the capacitive element varies with the Miller capacitance of the output transistor thereby continuously cancelling the Miller capacitance of the output transistor across a range of voltages of the output transistor.

2. The amplifier circuit of claim 1, wherein the Miller capacitance of the capacitive element is non-linear.

3. The amplifier circuit of claim 1, wherein the capacitive element comprises a transistor coupled to the output connection and to the input node.

4. The amplifier circuit of claim 1, wherein a Miller capacitor is coupled to the output connection.

5. The amplifier circuit of claim 1, wherein the capacitive element is coupled to a collector or drain of the output transistor and to bases or gates of the first and second current mirror transistors.

6. The amplifier circuit of claim 1, wherein the capacitive element comprises a transistor having a collector or drain coupled to a collector or drain of the output transistor.

7. The amplifier circuit of claim 6, wherein a base or gate of the transistor of the capacitive element is coupled to bases or gates of the first and second current mirror transistors.

8. An amplifier circuit, comprising:
   an input stage;
   a current mirror stage coupled to the input stage;
   an output stage coupled to the current mirror stage, the output stage having an output transistor; and
   a capacitive element coupled to the output transistor and an input node of the current mirror stage, wherein a current through the capacitive element is inverted relative to a current fed to the output transistor by the current mirror stage such that a Miller capacitance of the capacitive element counteracts a Miller capacitance of the output transistor, and wherein the capacitive element is configured such that the Miller capacitance of the capacitive element varies with the Miller capacitance of the output transistor thereby continuously cancelling the Miller capacitance of the output transistor across a range of voltages of the output transistor.

9. The amplifier circuit of claim 8, wherein the Miller capacitance of the capacitive element is non-linear.

10. The amplifier circuit of claim 8, wherein the capacitive element comprises a transistor coupled to the output transistor and the input node.

11. The amplifier circuit of claim 8, wherein a Miller capacitor is coupled to a collector or drain of the output transistor and a node between the input stage and the current mirror stage.

12. The amplifier circuit of claim 8, wherein the capacitive element is coupled to a collector or drain of the output transistor and to bases or gates of transistors of the current mirror stage.

13. The amplifier circuit of claim 8, wherein the capacitive element comprises a transistor having a collector or drain coupled to a collector or drain of the output transistor.

14. The amplifier circuit of claim 13, wherein a base or gate of the transistor of the capacitive element is coupled to bases or gates of transistors of the current mirror stage.

15. A method, comprising:
   providing an amplifier circuit having an input stage, a capacitive element, a current mirror stage coupled to the input stage, and an output stage coupled to the current mirror stage, wherein the capacitive element is coupled to the output transistor and an input node of the current mirror stage; and
   varying a Miller capacitance of the capacitive element with a Miller capacitance of the output transistor such that the Miller capacitance of the output transistor is continuously cancelled across a range of voltages of the output transistor,
   wherein the varying is based on current that passes through the capacitive element, and wherein said current is inverted relative to current fed to the output transistor by the current mirror stage.

16. The method of claim 15, wherein the capacitive element comprises a transistor coupled to the output transistor and the input node.

17. The method of claim 15, wherein a Miller capacitor is coupled to a collector or drain of the output transistor and a node that is between the input stage and the current mirror stage.

18. The method of claim 15, wherein the capacitive element is coupled to a collector or drain of the output transistor and to bases or gates of transistors of the current mirror stage.

19. The method of claim 15, wherein the capacitive element comprises a transistor having a collector or drain coupled to a collector or drain of the output transistor.

20. The method of claim 19, wherein a base or gate of the transistor of the capacitive element is coupled to bases or gates of transistors of the current mirror stage.

* * * * *